(12) United States Patent
Tsuji (10) Patent No.: US 10,811,289 B2
(45) Date of Patent: Oct. 20, 2020

(54) SUBSTRATE TRANSFER APPARATUS AND SUBSTRATE PROCESSING SYSTEM COMPRISING PLURAL CONNECTION UNITS ARRANGED SIDE BY SIDE IN A VERTICAL AND LATERAL DIRECTIONS ALONG ONE SIDE SURFACE OF A TRANSFER CHAMBER

(71) Applicant: TOKYO ELECTRON LIMITED, Tokyo (JP)

(72) Inventor: Norihiko Tsuji, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 35 days.

(21) Appl. No.: 16/272,150

(22) Filed: Feb. 11, 2019

(65) Prior Publication Data

US 2019/0252225 A1 Aug. 15, 2019

(30) Foreign Application Priority Data

Feb. 13, 2018 (JP) ................................ 2018-023070

(51) Int. Cl.
*H01L 21/67* (2006.01)
*H01L 21/677* (2006.01)
*H01L 21/673* (2006.01)

(52) U.S. Cl.
CPC .. *H01L 21/67265* (2013.01); *H01L 21/67017* (2013.01); *H01L 21/6773* (2013.01);
(Continued)

(58) Field of Classification Search
CPC ......... H01L 21/67742; H01L 21/67017; H01L 21/67265; H01L 21/67778;
(Continued)

(56) References Cited

U.S. PATENT DOCUMENTS 8,395,136 B2 * 3/2013 Kondoh ............ H01L 21/67742
250/221

FOREIGN PATENT DOCUMENTS

JP 2009094460 A 4/2009
JP 2015-76432 A 4/2015
(Continued)

*Primary Examiner* — Que Tan Le
(74) *Attorney, Agent, or Firm* — Nath, Goldberg & Meyer; Jerald L. Meyer (57) ABSTRACT

There is provided a substrate transfer apparatus for unloading each of a plurality of target substrates, which is to be transferred to each of a plurality of processing devices, from each of a plurality of containers connected to the substrate transfer apparatus, each of the plurality of containers being configured to accommodate the plurality of target substrates. The apparatus comprises: a transfer chamber including an arm disposed to take out each of the plurality of target substrates which is to be transferred to each of the plurality of processing devices from each of the plurality of containers; a plurality of connection units arranged side by side in a vertical direction and a lateral direction along one side surface of the transfer chamber, and connected to the plurality of containers, respectively; and movement mechanisms configured to move at least one of the plurality of connection units in the lateral direction.

9 Claims, 10 Drawing Sheets (52) U.S. Cl.
CPC .. *H01L 21/67379* (2013.01); *H01L 21/67393* (2013.01); *H01L 21/67733* (2013.01); *H01L 21/67742* (2013.01); *H01L 21/67769* (2013.01); *H01L 21/67775* (2013.01); *H01L 21/67778* (2013.01)

(58) Field of Classification Search
CPC ........... H01L 21/67379; H01L 21/6773; H01L 21/67775; H01L 21/67766; H01L 21/67769
USPC ................................................ 250/221, 239
See application file for complete search history.

(56) References Cited

FOREIGN PATENT DOCUMENTS

| | | | |
|---|---|---|---|
| KR | 10-2015-0040762 A | 4/2015 | |
| KR | 1020140134314 A | 4/2015 | |

* cited by examiner

SUBSTRATE TRANSFER APPARATUS AND SUBSTRATE PROCESSING SYSTEM COMPRISING PLURAL CONNECTION UNITS ARRANGED SIDE BY SIDE IN A VERTICAL AND LATERAL DIRECTIONS ALONG ONE SIDE SURFACE OF A TRANSFER CHAMBER

CROSS-REFERENCE TO RELATED APPLICATION

This application is based upon and claims the benefit of priority from Japanese Patent Application No. 2018-023070, filed on Feb. 13, 2018, the entire contents of which are incorporated herein by reference.

TECHNICAL FIELD

Embodiments of the present disclosure relate to a substrate transfer apparatus and a substrate processing system.

BACKGROUND

A substrate processing system for performing a plasma process or the like on a semiconductor wafer (hereinafter simply referred to as a "wafer") as a target substrate, includes a process module (PM) that functions as a vacuum processing chamber, a container that accommodates a plurality of wafers, and a loader module (LM) that functions as an atmospheric transfer chamber. For example, a front opening unified pod (FOUP) is known as the container for accommodating a plurality of wafers.

The LM has a load port (LP) for connecting the FOUP. The LP is a kind of front-opening interface mechanical standard (FIMS) port. A load-lock module (LLM) that functions as an atmosphere/vacuum switching room is connected to the LM. A transfer module (TM) that functions as a vacuum transfer chamber is connected to the LLM. The PM is connected to the TM. The wafer in the FOUP connected to the LP is taken out from the FOUP and transferred to the LLM by a transfer arm provided in the LM. The wafer transferred to the LLM is taken out from the LLM and transferred to the PM by a transfer arm provided in the TM. The wafer is processed in the PM.

In such a substrate processing system, a plurality of PMs may be connected to the TM and the plurality of wafers may be processed in parallel by the plurality of PMs. This improves throughput of wafer processing. Further, in this case, a plurality of LPs may be provided in the LM and the FOUP may be connected to each LP. This reduces a waiting time of the PM due to attachment and detachment of the FOUP.

Incidentally, when a plurality of wafers accommodated in a single FOUP is individually processed in different PMs, it is difficult to manage in which PM a processed wafer has been processed. For example, when any of the PMs is defective, it is difficult to identify, in the FOUP, the wafer processed by the defective PM. Therefore, there is a need to associate FOUPs with PMs on a one-to-one basis from the viewpoint of reproducibility in production control of products.

In addition, from the viewpoint of further improving throughput of wafer processing, the number of PMs connected to TM tends to increase. However, in the case where FOUPs and PMs are associated with one another on a one-to-one basis, even if the number of PMs increases, when the number of LPs to which FOUPs are connected is smaller than the number of PMs, an idle PM occurs. This results in degradation in throughput. As such, even if FOUPs and PMs are associated with one another on a one-to-one basis, it is necessary to increase the number of LPs to which the FOUPs are connected to be larger than the number of PMs in order to ensure high throughput. However, when the number of LPs is increased in an LM, the LM becomes larger and an area occupied by the substrate processing system inside a facility such as a clean room becomes larger.

SUMMARY

According to one embodiment of the present disclosure, there is provided a substrate transfer apparatus for unloading each of a plurality of target substrates, which is to be transferred to each of a plurality of processing devices, from each of a plurality of containers connected to the substrate transfer apparatus, each of the plurality of containers being configured to accommodate the plurality of target substrates, the substrate transfer apparatus including: a transfer chamber including an arm disposed to take out each of the plurality of target substrates which is to be transferred to each of the plurality of processing devices from each of the plurality of containers; a plurality of connection units arranged side by side in a vertical direction and a lateral direction along one side surface of the transfer chamber, and connected to the plurality of containers, respectively; and movement mechanisms configured to move at least one of the plurality of connection units in the lateral direction.

According to another embodiment of the present disclosure, there is provided a substrate processing system which includes: a plurality of processing devices configured to process a plurality of target substrates; and a substrate transfer apparatus configured to unload each of the plurality of target substrates, which is to be transferred to each of the plurality of processing devices, from each of a plurality of containers connected to the substrate transfer apparatus, each of the plurality of containers being configured to accommodate the plurality of target substrates, wherein the substrate transfer apparatus includes: a transfer chamber including an arm disposed to take out each of the plurality of target substrates which is to be transferred to each of the plurality of processing devices from each of the plurality of containers; a plurality of connection units arranged side by side in a vertical direction and a lateral direction along one side surface of the transfer chamber, and connected to the plurality of containers, respectively; and movement mechanisms configured to move at least one of the plurality of connection units in the lateral direction.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A substrate transfer apparatus and a substrate processing system according to an embodiment will be described in detail below with reference to the figures. The substrate transfer apparatus and the substrate processing system are not limited by the following embodiments.

First Embodiment

[Configuration of Substrate Processing System]

Figure 1:
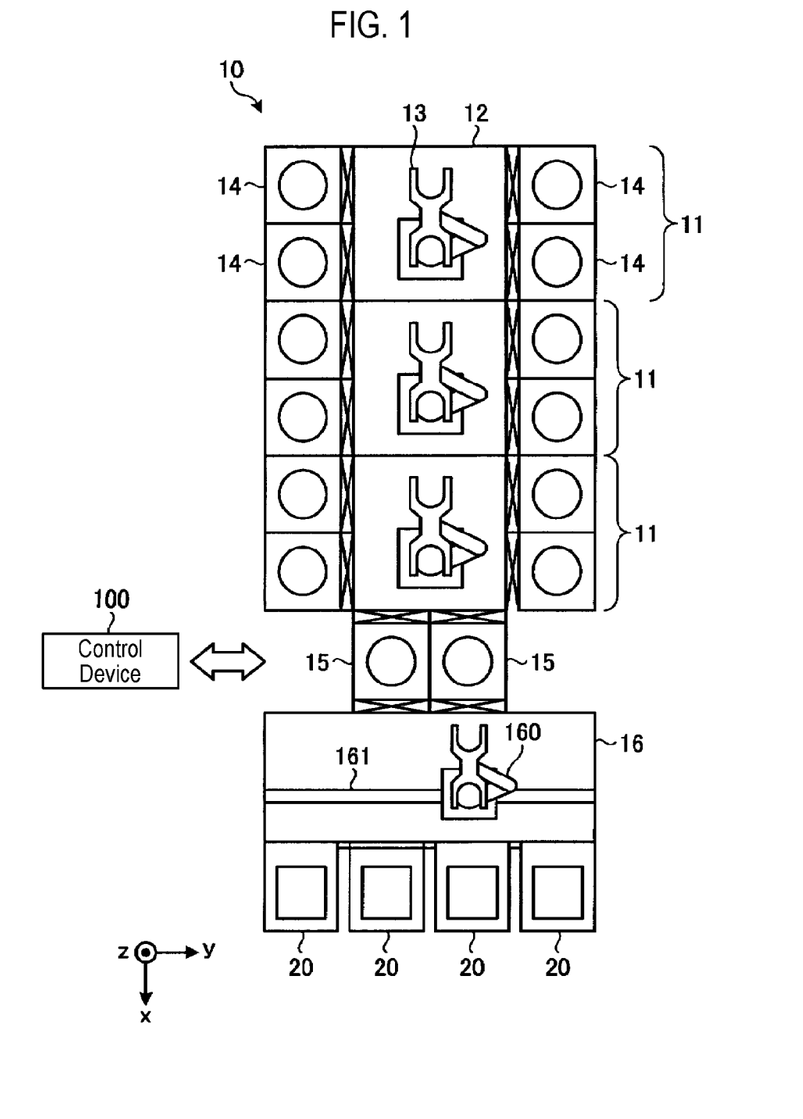
FIG. 1 is a plan view schematically illustrating an example of a configuration of a substrate processing system.

FIG. 1 is a plan view schematically illustrating an example of a configuration of a substrate processing system 10. For the sake of easier understanding, FIG. 1 is drawn such that some internal components are revealed.

As illustrated in FIG. 1, for example, the substrate processing system 10 includes a plurality of processing units 11 connected with each other in a horizontal direction (e.g., an x-axis direction in FIG. 1), a plurality of load-lock modules (LLMs) 15, and a loader module (LM) 16. In this embodiment, the substrate processing system 10 includes three processing units 11 connected with each other in an X-axis direction. In the substrate processing system 10 according to the present embodiment, the number of processing units 11 connected with each other in the X-axis direction may be increased. The number of processing units 11 connected with each other in the X-axis direction may be two or less.

A transfer module (TM) 12 and a plurality of processing module (PMs) 14 are connected to each of the processing units 11. In this embodiment, in each of the processing units 11, four PMs 14 are connected to the TM 12. As another example, the number of PMs 14 connected to the TM 12 may be three or less, or five or more. Each of the PMs 14 performs processes such as a plasma-based etching, film formation and the like on a wafer. Each of the PMs 14 is an example of a processing apparatus. The PMs 14 may be modules that execute the same step or different steps in manufacturing steps. A transfer robot 13 is provided in the TM 12. The interior of the TM 12 is maintained at a predetermined degree of vacuum.

One of the plurality of processing units 11 is connected to the LM 16 via the plurality of LLMs 15. A transfer robot 160 is provided in the LM 16. The transfer robot 160 moves inside the LM 16 along a rail 161 installed in the LM 16. In the LM 16, a plurality of connection units 20 are provided in a surface (hereinafter, referred to as a "front surface") which faces a side surface to which the plurality of LLMs 15 are connected. Each of the connection units 20 is connected to a FOUP which is a container that accommodates a plurality of wafers. The LM 16 is an example of a substrate transfer apparatus. The transfer robot 160 is an example of an arm.

As described above, the connection units 20 of the present embodiment are disposed to one surface of the LM 16, that is to say, on the front surface of the LM 16. As a result, another surface (for example, a side surface) of the LM 16 may be effectively used for arranging another apparatus such as an apparatus for inspecting the wafer or forming an entrance used when performing maintenance of the wafer.

When the FOUP is connected to the connection unit 20, the transfer robot 160 moves inside the LM 16 along the rail 161, takes out one sheet of unprocessed wafer from the FOUP, and carries the same into one of the LLMs 15. When the unprocessed wafer is carried into the LLM 15, a gate valve provided in the LLM 15 is closed and the interior of the LLM 15 is evacuated.

When the interior of the LLM 15 is kept at a predetermined degree of vacuum, a gate valve at the side of the TM 12 is opened, and the unprocessed wafer is carried out from the LLM 15 by the transfer robot 13 of the TM 12. The unprocessed wafer carried out from the LLM 15 is carried into the PM 14 connected to the respective TM 12 or another PM 14 connected to another TM 12 by the transfer robot 13. In the case where the unprocessed wafer is carried into another PM 14 connected to another TM 12, the transfer robot 13 delivers the unprocessed wafer to another transfer robot 13 of another TM 12 adjacent to the respective TM 12.

Further, when the processing of the PM 14 is completed, the transfer robot 13 carries out a processed wafer from the PM 14. In the case where the LLM 15 is connected to the TM 12 provided with the transfer robot 13, the transfer robot 13 carries the processed wafer into the LLM 15. In the case where no LLM 15 is connected to the TM 12, the transfer robot 13 delivers the processed wafer to the transfer robot 13 of another TM 12 adjacent to the respective TM 12.

When the processed wafer is carried into the LLM 15, the gate valve provided at the side of the LLM 15 is closed. Air is introduced into the LLM 15 such that an internal pressure of the LLM 15 is returned to atmospheric pressure. When the internal pressure of the LLM 15 reaches the atmospheric pressure, the gate valve at the side of the LM 16 is opened. By the transfer robot 160 of the LM 16, the processed wafer is carried out from the LLM 15 and is returned to the FOUP connected to the connection unit 20.

The substrate processing system 10 includes a control device 100. The control device 100 includes a memory, a processor, and an input/output interface (I/F). The processor of the control device 100 controls each part of the substrate processing system 10 via the input/output I/F on the basis of a program and data read from the memory.

In the present embodiment, the control device 100 controls the transfer of the wafer such that the FOUPs and the PMs 14 are mapped to each other in a one-to-one basis. Therefore, the wafer taken out from a FOUP is processed by the PM 14 mapped to the FOUP. In this embodiment, the number of connection units 20 connected to the LM 16 is larger than the number of PMs 14 provided in the substrate processing system 10. Therefore, a larger number of FOUPs than the number of PMs 14 may be connected to the LM 16. As a result, it is possible to reduce a processing standby time of the PMs 14 for the replacement of the FOUP. As a result, the plurality of PMs 14 can be operated in an efficient manner, thus improving throughput.

[Configuration of Loader Module (LM)]

Figure 2:
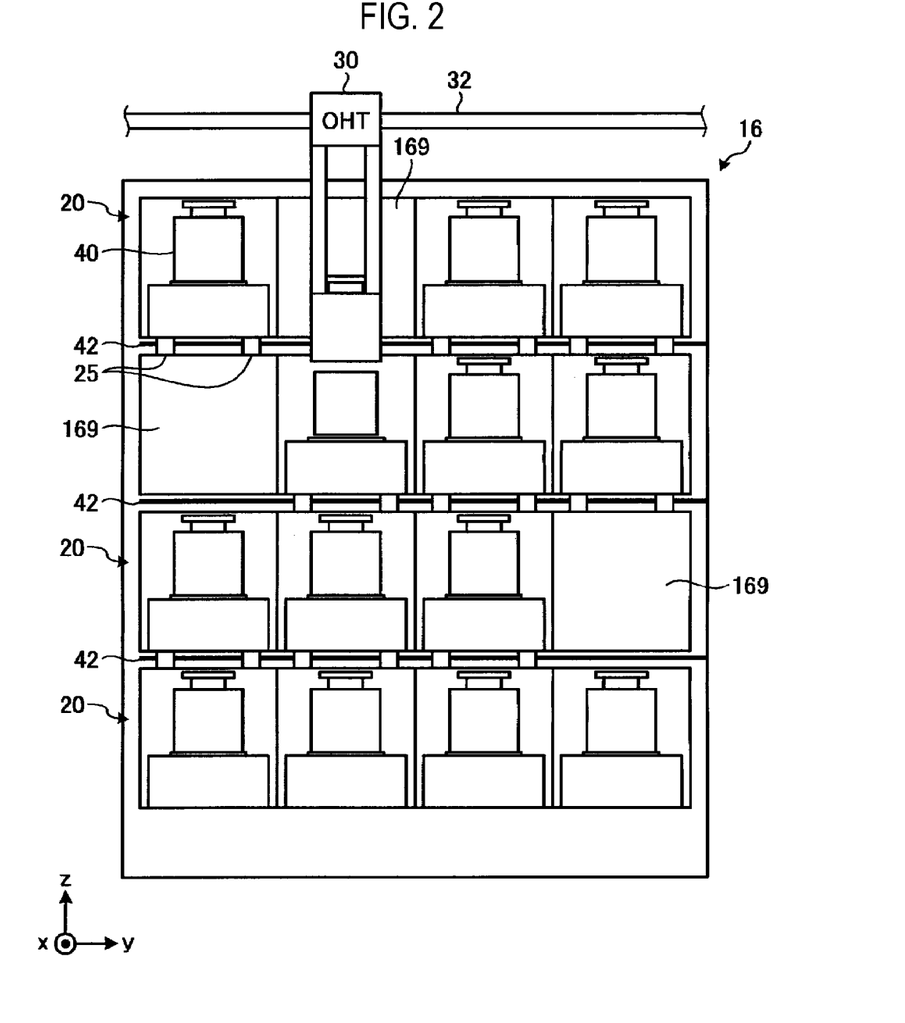
FIG. 2 is a front view schematically illustrating an example of a configuration of a loader module (LM) in a first embodiment.
Figure 3:
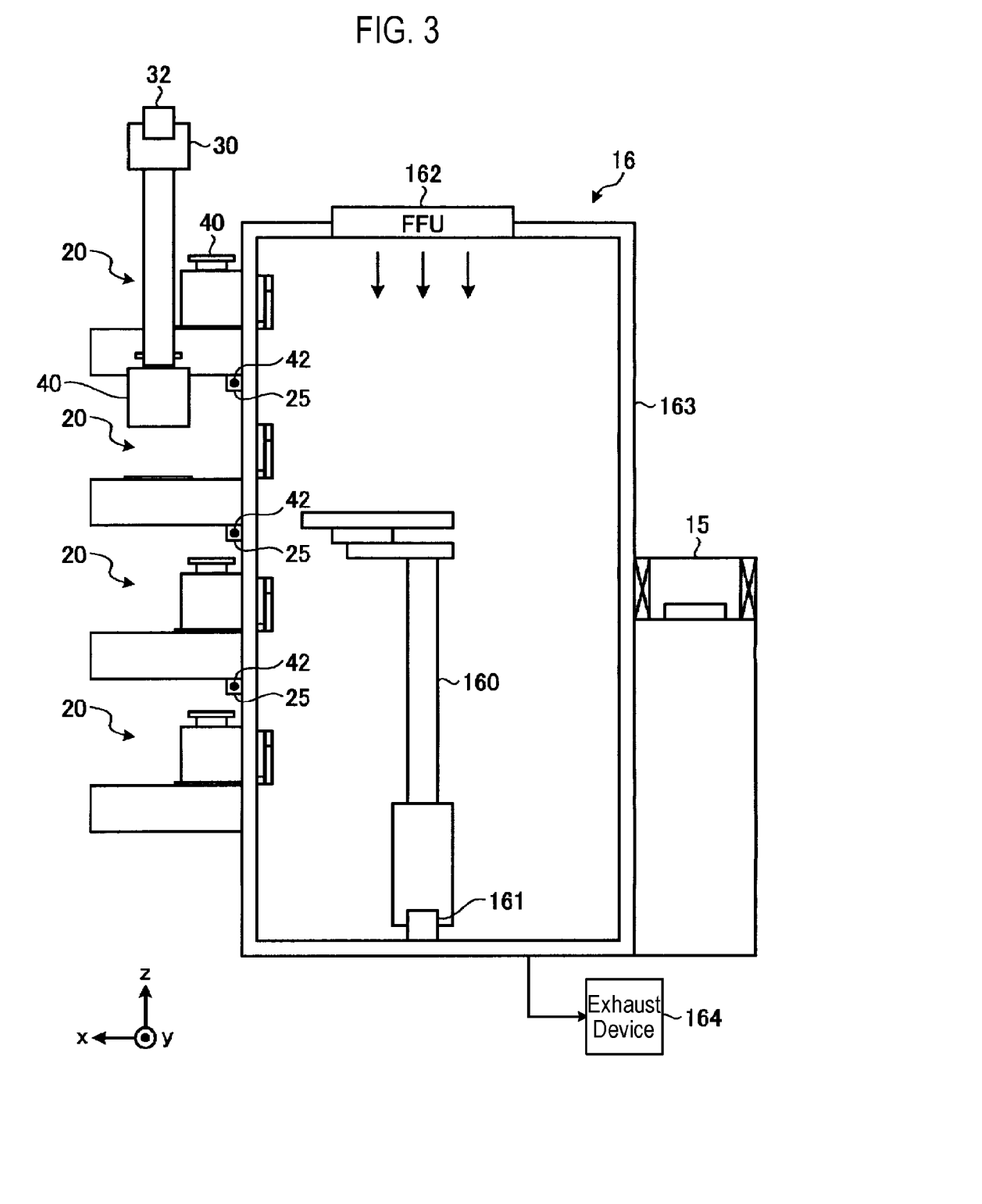
FIG. 3 is a view schematically illustrating an example of a positional relationship between LMs and respective connection units in the first embodiment.

FIG. 2 is a front view schematically illustrating an example of the configuration of the LM 16 in a first embodiment. FIG. 3 is a view schematically illustrating an example of a positional relationship between the LM 16 and each connection unit 20 in the first embodiment.

The plurality of connection units 20 are vertically arranged in multiple stages in one side surface of the LM 16. Specifically, as illustrated in FIG. 2, for example, the plurality of connection units 20 are arranged in four stages at the side of the front surface of the LM 16 in a Z-axis direction, namely the vertical direction.

In addition, in the LM 16 of the present embodiment, the number of connection units 20 arranged in each stage above the lowermost stage is smaller than the number of connection units 20 arranged in the lowermost stage. For example, as illustrated in FIG. 2, four connection units 20 are arranged in the lowermost stage, and three connection units 20 are arranged in each of three stages above the lowermost stage. Each of the connection units 20 is capable of connecting the respective FOUP 40 to the LM 16.

The FOUPs 40 are mounted on the connection units 20, respectively. Each of the FOUP 40 is transferred by an overhead hoist transfer (OHT) 30. The OHT 30 moves in a facility such as a clean room along a rail 32.

For example, as illustrated in FIG. 3, the LM 16 includes a fan filter unit (FFU) 162 and a housing 163. The housing 163 is an example of a transfer chamber. The FFU 162 supplies a particle-free air into an internal space of the LM 16, which is defined by the housing 163, from the top. An exhaust device 164 is coupled to a lower portion of the LM 16 via an exhaust pipe. The air supplied from the FFU 162 into the LM 16 is exhausted from the lower portion of the LM 16. Therefore, an air flow orienting downward from above is formed inside the LM 16. Further, in the present embodiment, the FFU 162 and the exhaust device 164 are controlled by the control device 100 such that an internal pressure of the LM 16 becomes a positive pressure. This makes it possible to suppress particles from entering into the LM 16 from outside of the LM 16.

Further, as illustrated in FIG. 2, for example, in each of three stages from the uppermost stage to the third stage, a movement mechanism 25 configured to move the connection unit 20 in a lateral direction (a Y-axis direction in FIG. 2) along a guide shaft 42 is installed in each of the connection units 20. In this embodiment, the movement mechanism 25 moves the connection unit 20 in the lateral direction along the guide shaft 42 by rotating a nut fitted into the guide shaft 42 in which a thread groove is formed by a motor or the like. The rotational force of the motor is transmitted to the nut fitted into the guide shaft 42 via, for example, a belt having grooves formed in the inner side thereof. The movement mechanism 25 may be a hollow rotary actuator that rotates the nut fitted into the guide shaft 42 having the thread groove formed therein. For example, as illustrated in FIGS. 2 and 3, the guide shaft 42 is provided for each connection unit 20 in each stage. In each of three stages from the uppermost stage to the third stage, the connection units 20 are moved in the lateral direction by the movement mechanism 25 independently of one another. The connection units 20 arranged in lowermost stage are fixed to the housing 163 of the LM 16.

In the LM 16 of the present embodiment, the number of connection units 20 arranged in each stage above the lowermost stage is smaller than the number of connection units 20 arranged in the lowermost stage. Therefore, at least one surface 169 on which no connection unit 20 is disposed exists in each stage from the uppermost stage to the third stage. In each stage from the uppermost stage to the third stage, when each of the connection units 20 moves in the lateral direction, a position of the surface 169 on which no connection unit 20 is disposed is changed at the side of the front surface of the LM 16.

[Movement of Connection Unit]

Figure 4:
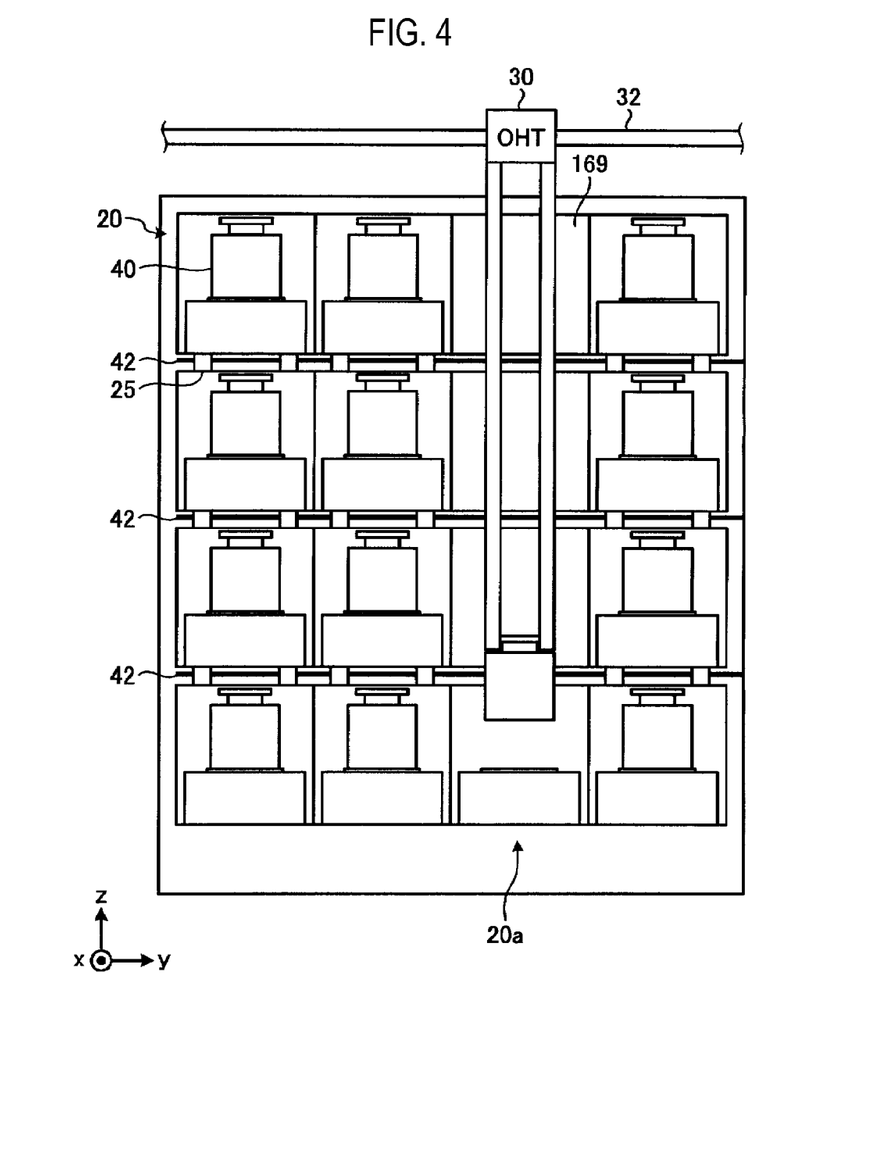
FIG. 4 is a view illustrating an example of movement of the connection unit in the first embodiment.

FIG. 4 is a view illustrating an example of the movement of the connection unit 20 in the first embodiment. In a case where the FOUP 40 is mounted on the connection unit 20 by the OHT 30, positions of another connection units 20 are controlled such that the surface 169 on which no connection unit 20 is disposed is formed above the respective connection unit 20. For example, the FOUP 40 is assumed to be mounted on a second connection unit 20a from the right side in the lowermost stage. Then, for example, as illustrated in FIG. 4, in each stage from the uppermost stage to the third stage, the first connection unit 20 from the right side is moved to the rightmost position. Also, the second and third connection units 20 from the right side are moved to the left side in a state where they are adjacent to each other. As a result, the surfaces 169 on which no connection unit 20 is disposed are formed above the connection unit 20a. Thus, the OHT 30 is capable of mounting the FOUP 40 directly on the connection unit 20a. The same is also true in a case where the FOUP 40 which accommodates the processed wafer is withdrawn from the connection unit 20a by the OHT 30.

The respective FOUPs 40 mounted on the connection units 20 and the PMs 14 that process the wafers accommodated in the respective FOUPs 40 are managed by the control device 100 in a one-to-one basis. Therefore, even when the positions of the connection units 20 are changed, the control device 100 controls the transfer robot 160 and the transfer robot 13 of each of the TMs 12 such that the wafer taken out from the same FOUP 40 are transferred to the same PM 14.

As described above, in the substrate processing system 10 of the present embodiment, it is possible to directly transfer the FOUP 40 which accommodates unprocessed wafers to the respective connection unit 20 by the OHT 30, and directly withdraw the FOUP which accommodates processed wafers from the respective connection unit 20 by the OHT 30. Therefore, it is not necessary to provide a transfer mechanism separately from the OHT 30 in order to transfer the FOUP 40 transferred by the OHT 30 to each connection unit 20. Further, it is not necessary to provide a relay station for temporarily mounting the FOUP 40 thereon in order to deliver the FOUP 40 transferred by the OHT 30 to the transfer mechanism. Therefore, it is possible to utilize a region where the transfer mechanism and the relay station are to be disposed as a region where the connection unit 20 is to be disposed. Thus, it is possible to connect a large number of FOUPs 40 in a smaller space.

[Details of Connection Unit]

Figure 5:
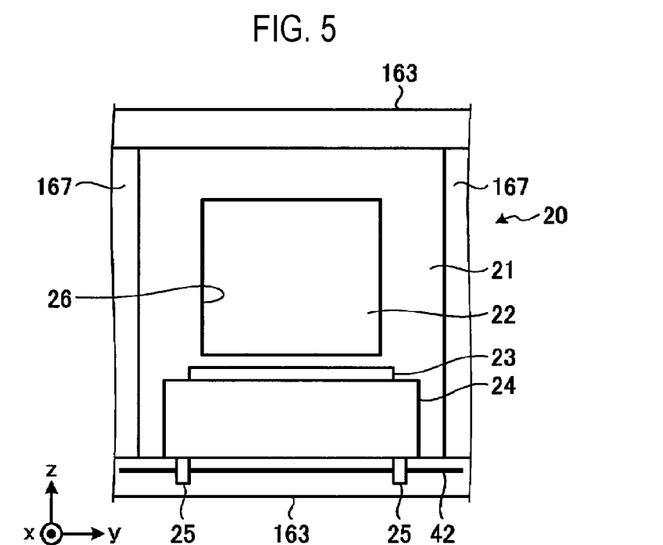
FIG. 5 is a front view schematically illustrating an example of the configuration of the connection unit.
Figure 6:
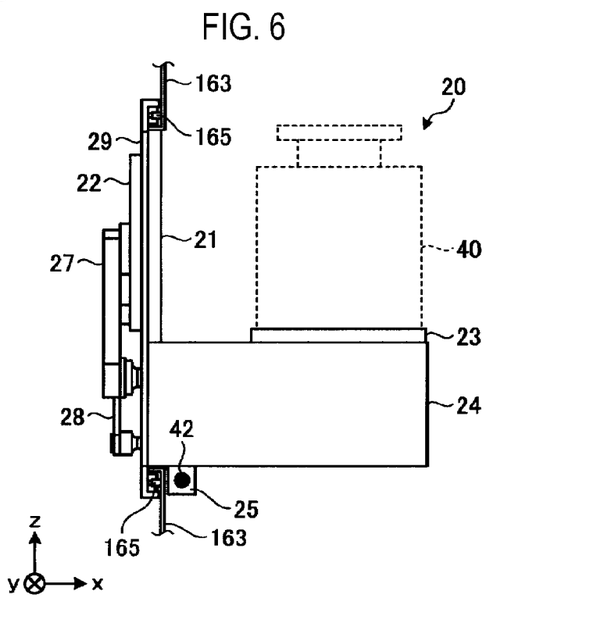
FIG. 6 is a side view schematically illustrating an example of the configuration of the connection unit.
Figure 7:
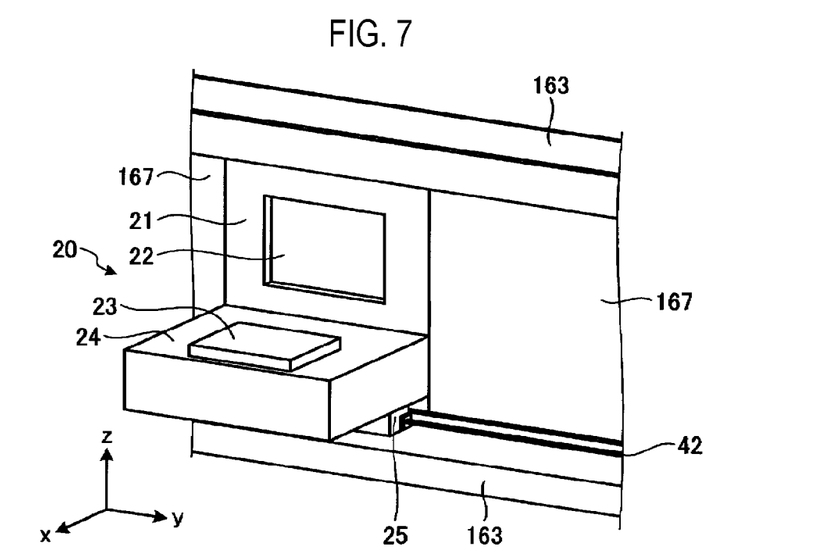
FIG. 7 is a perspective view schematically illustrating an example of the configuration of the connection unit.
Figure 8:
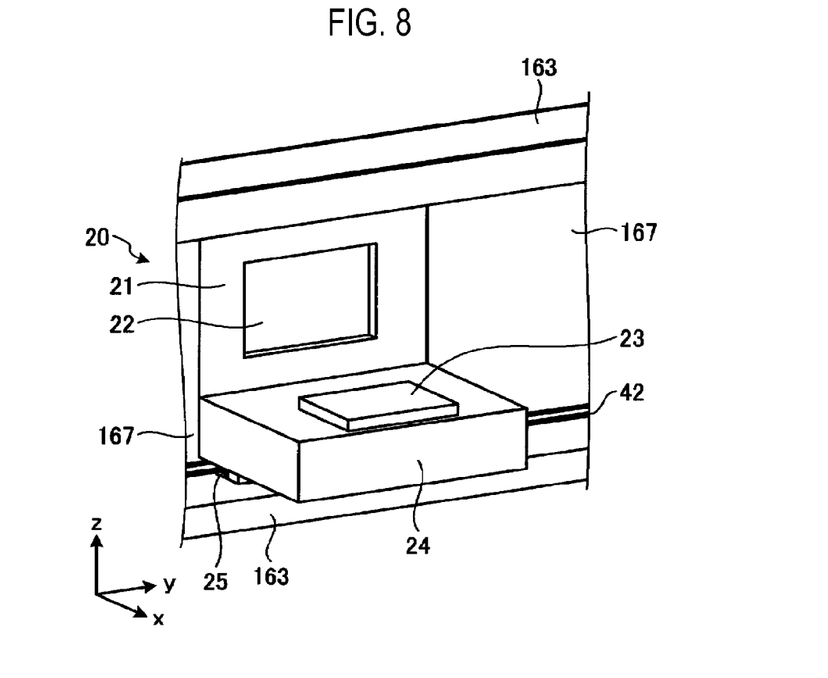
FIG. 8 is a perspective view schematically illustrating an example of the configuration of the connection unit.
Figure 9:
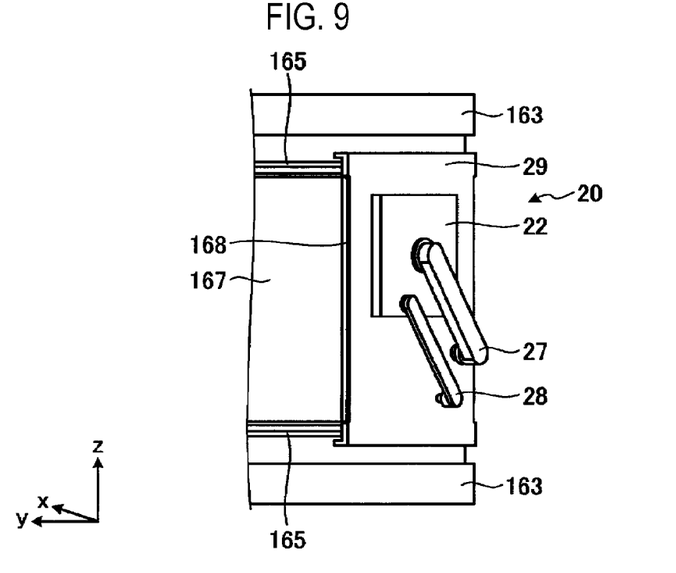
FIG. 9 is a perspective view schematically illustrating an example of the configuration of the LM at the side of the connection unit.

FIG. 5 is a front view schematically illustrating an example of the configuration of the connection unit 20. FIG. 6 is a side view schematically illustrating an example of the configuration of the connection unit 20. FIGS. 7 and 8 are perspective views schematically illustrating an example of the configuration of the connection unit 20. FIG. 9 is a perspective view schematically illustrating an example of the configuration of the connection unit 20 at the side of the LM 16.

As illustrated in FIG. 5, for example, the connection unit 20 includes a frame 21, a door 22, a stage 23, a base 24, the movement mechanism 25, an arm 27, an arm 28, and an inner frame 29. An opening 26 is formed in the frame 21. The opening 26 is closed from the side of the LM 16 by the door 22 having an outer shape larger than the opening 26. The stage 23 is provided on an upper surface of the base 24 so as to be movable in the X-axis direction. The plurality of movement mechanisms 25 is provided on a lower surface of the base 24. Motors or the like included in the movement mechanisms 25 are disposed inside, for example, the base 24.

For example, as illustrated in FIGS. 6 and 9, the inner frame is installed on a surface of the connection unit 20 at the side of the LM 16. For example, as illustrated in FIGS. 6 and 9, a guide 165 is provided inside the housing 163 of the LM 16. The inner frame 29 is fixed onto the base 24. Each of the movement mechanisms 25 provided on a lower surface of the base 24 rotates the nut into which the guide shaft 42 is inserted, so that the entire connection unit 20 moves in the lateral direction along the guide shaft 42 and the guide 165.

In the case where the FOUP 40 which accommodates unprocessed wafers is mounted on the connection unit 20, the stage 23 moves to a position away from the frame 21 on the upper surface of the base 24. Then, for example, as illustrated in FIG. 6, the FOUP 40 is mounted on the upper surface of the stage 23. Subsequently, the stage 23 moves toward the frame 21 on the upper surface of the base 24, so that a lid of the FOUP 40 at the side of the LM 16 is brought into contact with the door 22 via the opening 26 of the frame 21. Then, the lid of the FOUP 40 is attracted to the door 22 so that the lid of the FOUP 40 is detached together with the door 22. The wafers accommodated in the FOUP 40 are unloaded by the transfer robot 160 via the opening 26 of the frame 21.

In the case where the FOUP 40 which accommodates the processed wafers is withdrawn, the door 22 moves to a position where the opening 26 of the frame 21 is closed, and the attraction between the door 22 and the lid of the FOUP 40 is released. As a result, the lid of the FOUP 40 is attached to the FOUP 40. Subsequently, the stage 23 moves to a position away from the frame 21 on the upper surface of the base 24. The FOUP 40 is withdrawn by the OHT 30.

For example, as illustrated in FIGS. 6 and 9, the arm 27 and the arm 28 support the door 22 with respect to the inner frame 29. In the case where the FOUP 40 in which unprocessed wafers are accommodated is mounted on the stage 23, the arm 27 causes the door 22 and the lid of the FOUP 40 to be attracted to each other by an attraction mechanism (not illustrated). A suction pump and the like connected to the attraction mechanism are disposed inside, for example, the base 24.

Figure 10:
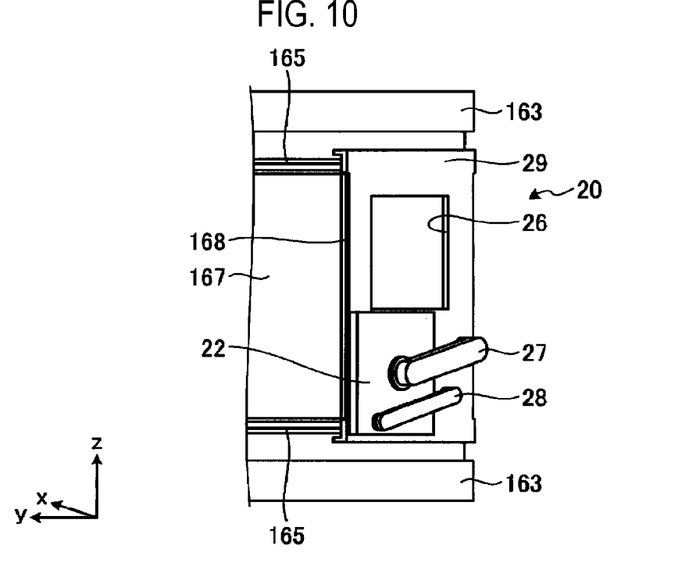
FIG. 10 is a perspective view schematically illustrating an example of the configuration of the LM at the side of the connection unit in a state in which a door is opened.

Then, the arm 27 and the arm 28 move the door 22 to which the lid of the FOUP 40 is attracted, in a direction away from the inner frame 29. Subsequently, for example, as illustrated in FIG. 10, the arm 27 and the arm 28 rotate counterclockwise relative to the inner frame 29 so that the door 22 to which the lid of the FOUP 40 is attracted is moved downward from the opening 26. At this time, the arm 27 and the arm 28 move the door 22 to which the lid of the FOUP 40 is attracted, to a position at which the door 22 does not interfere with either the opening 26 which has been covered by the door 22, or another opening 26 of the connection unit 20 disposed in the lower stage.

In the case where the FOUP 40 in which processed wafers are accommodated is withdrawn, the arm 27 and the arm 28 rotate, for example, clockwise with respect to the inner frame 29, so that the door 22 to which the lid of the FOUP 40 is attracted is moved to a position at which the opening 26 of the frame 21 is closed. Then, the arm 27 and the arm 28 close the opening 26 of the frame 21 by moving the door 22 toward the inner frame 29. Subsequently, the arm 27 releases the attraction between the door 22 and the lid of the FOUP 40.

For example, as illustrated in FIGS. 5, 7, 8, and 9, in each stage, the surface 169 on which no connection unit 20 is disposed is covered with a seal belt 167. A predetermined tension is applied to the seal belt 167 in a direction in which the seal belt 167 is wound by a winding part 168 provided in the inner frame 29. Since the surface 169 on which no connection unit 20 is disposed is covered with the seal belt 167, it is possible to suppress particles from entering from the surface 169 on which no connection unit 20 is disposed into the LM 16. The seal belt 167 is an example of a cover member.

The first embodiment has been described above. According to the substrate processing system 10 of the present embodiment, it is possible to dispose a large number of FOUPs 40 each of which accommodates wafers, in a small space.

Second Embodiment

In the LM 16 of the first embodiment, the connection units 20 other than the connection units 20 arranged in the lowermost stage move in the lateral direction along the surface of the LM 16 independently of one another. A LM 16A of a second embodiment is different from the LM 16 of the first embodiment in that a plurality of rows in which a plurality of connection units 20 is arranged in a vertical direction are defined and the plurality of connection units 20 moves in the lateral direction on a row basis. Hereinafter, the LM 16A of the second embodiment will be described with a focus on the differences from that of the first embodiment.

Figure 11:
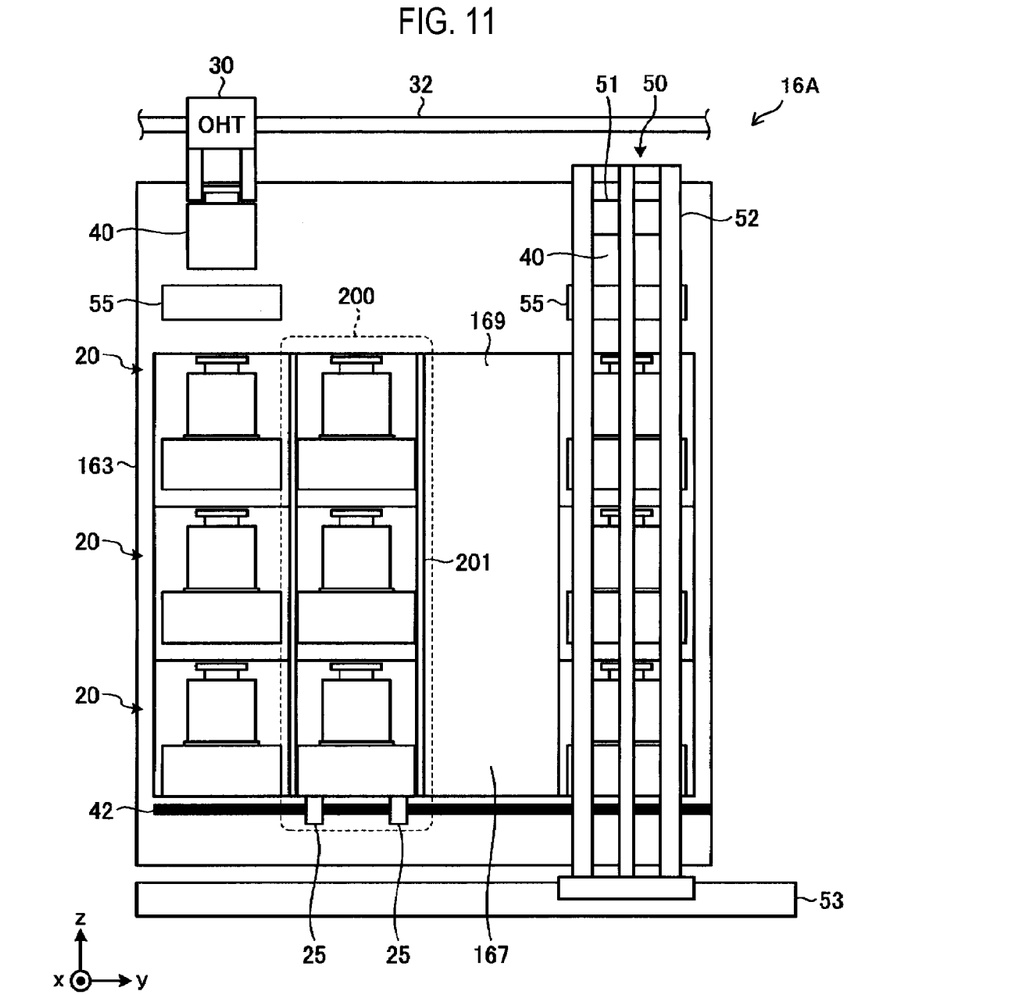
FIG. 11 is a front view schematically illustrating an example of a configuration of an LM in a second embodiment.
Figure 12:
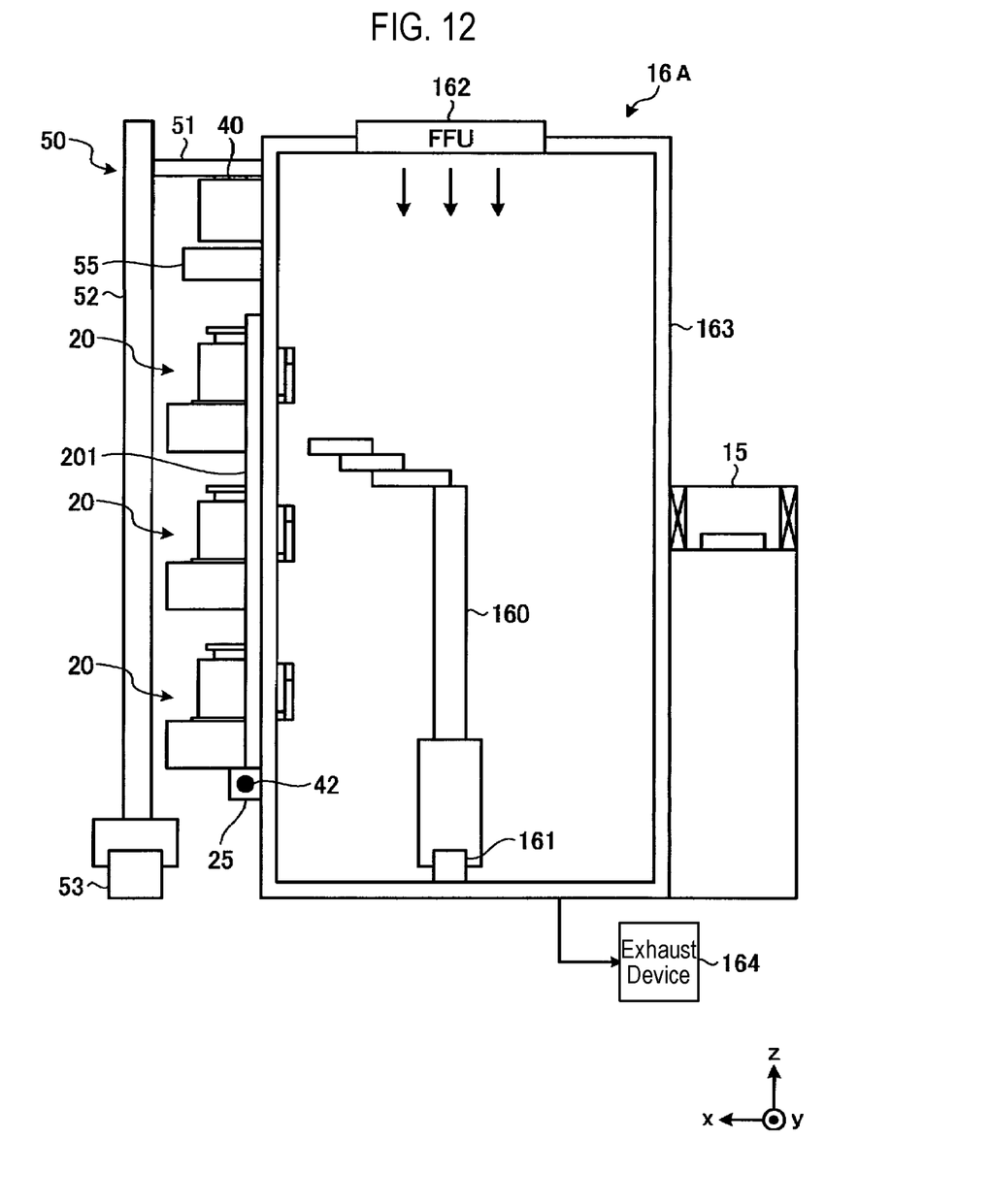
FIG. 12 is a view schematically illustrating an example of a positional relationship between LMs and respective connection units in the second embodiment.

FIG. 11 is a front view schematically illustrating an example of the configuration of the LM 16A in the second embodiment. FIG. 12 is a view schematically illustrating an example of a positional relationship between the LM 16A and each connection unit 20 in the second embodiment.

In the present embodiment, the plurality of rows in each of which the plurality of connection units 20 is arranged in the vertical direction is arranged in the lateral direction on the front surface of the LM 16A. Specifically, for example, as illustrated in FIG. 11, three rows in each of which three connection units 20 are arranged in the vertical direction on the front surface of the LM 16A, are defined in the lateral direction. In some embodiments, on the front surface of the LM 16A, four or more rows in each of which four or more connection units 20 are arranged in the vertical direction may be defined in the lateral direction.

In the LM 16A of the present embodiment, the rightmost row and the leftmost row are fixed to the housing 163 of the LM 16A. In addition, the plurality of connection units 20 which are included in a row (a row 200 in the example of FIG. 11) other than the rightmost row and the leftmost row, are fixed to each other by a frame 201. Further, inside the housing 163 of the LM 16A, a guide (not illustrated) is provided at a position of the uppermost connection unit 20 in the row 200, which corresponds to the upper portion of the inner frame 29. Further, inside the housing 163 of the LM 16A, a guide (not illustrated) is provided at a position of the lowermost connection unit 20 in the row 200, which corresponds to the lower portion of the inner frame 29.

Movement mechanisms 25 for moving the plurality of connection units 20 included in the row 200 along the guide shaft 42 in the lateral direction (the Y-axis direction in FIG. 11) are installed in the lowermost connection unit 20 of the row 200. The movement mechanisms 25 of the present embodiment are similar to those provided in the connection unit 20 of the first embodiment. In accordance with a control signal provided from the control device 100, the movement mechanisms 25 rotate a nut into which the guide shaft 42 is inserted, so that the plurality of connection units 20 included in the row 200 are moved as a unit in the lateral direction along the guide (not illustrated) provided inside the housing 163.

For example, as illustrated in FIG. 11, the surface 169 on which no connection unit 20 is disposed are formed between the rightmost row and the row 200 or between the leftmost row and the row 200. Then, as the row 200 moves in the lateral direction, the position of the surface 169 on which no connection unit 20 is disposed is changed at the side of the front surface of the LM 16A.

A seal belt 167 is disposed between the rightmost row and the row 200 and between the leftmost row and the row 200, as in the first embodiment. As a result, it is possible to suppress particles from entering from the surface 169 on which no connection unit 20 is disposed into the LM 16A.

In the present embodiment, since the plurality of connection units 20 in the row 200 moves in the lateral direction as a unit, at least one guide shaft 42 for moving the row 200 may be provided at the lower portion of the LM 16A. This makes it possible to form, in a wide range, the surface 169 on which no connection unit 20 is disposed. Thus, in the present embodiment, the surface 169 on which no connection unit 20 is disposed may be used as an entrance for performing maintenance of the interior of the LM 16A. Therefore, the side surfaces of the LM 16A may be effectively used as a space for mounting the connection units 20, an inspection unit and the like, which are parts other than the entrance for maintenance.

At least one waiting table 55 is provided in an upper portion of the front surface of the LM 16A so as to temporarily mount the FOUP 40 transferred by the OHT 30 thereon. In the example of FIG. 11, two waiting tables 55 are provided in the upper portion of the front surface of the LM 16A. For example, the OHT 30 mounts the FOUP 40 in which unprocessed wafers are accommodated on one waiting table 55, and withdraws the FOUP 40 in which processed wafers are accommodated from the other waiting table 55.

Further, a transfer mechanism 50 configured to transfer the FOUP 40 between the waiting table 55 and each connection unit 20 is provided in the LM 16A. The transfer mechanism 50 includes a gripping part 51, a frame 52, and a rail 53. The gripping part 51 moves in the vertical direction along the frame 52. The frame 52 moves in the lateral direction along the rail 53. The movement of the transfer mechanism 50 in the lateral direction, the movement of the gripping part 51 in the vertical direction, and the gripping and opening of the FOUP 40 by the gripping part 51 are controlled by the control device 100. Since the structure of the connection unit 20 described in the second embodiment is the same as the structure of that in the first embodiment, and a detailed description thereof will be omitted.

[Movement of Connection Unit]

Figure 13:
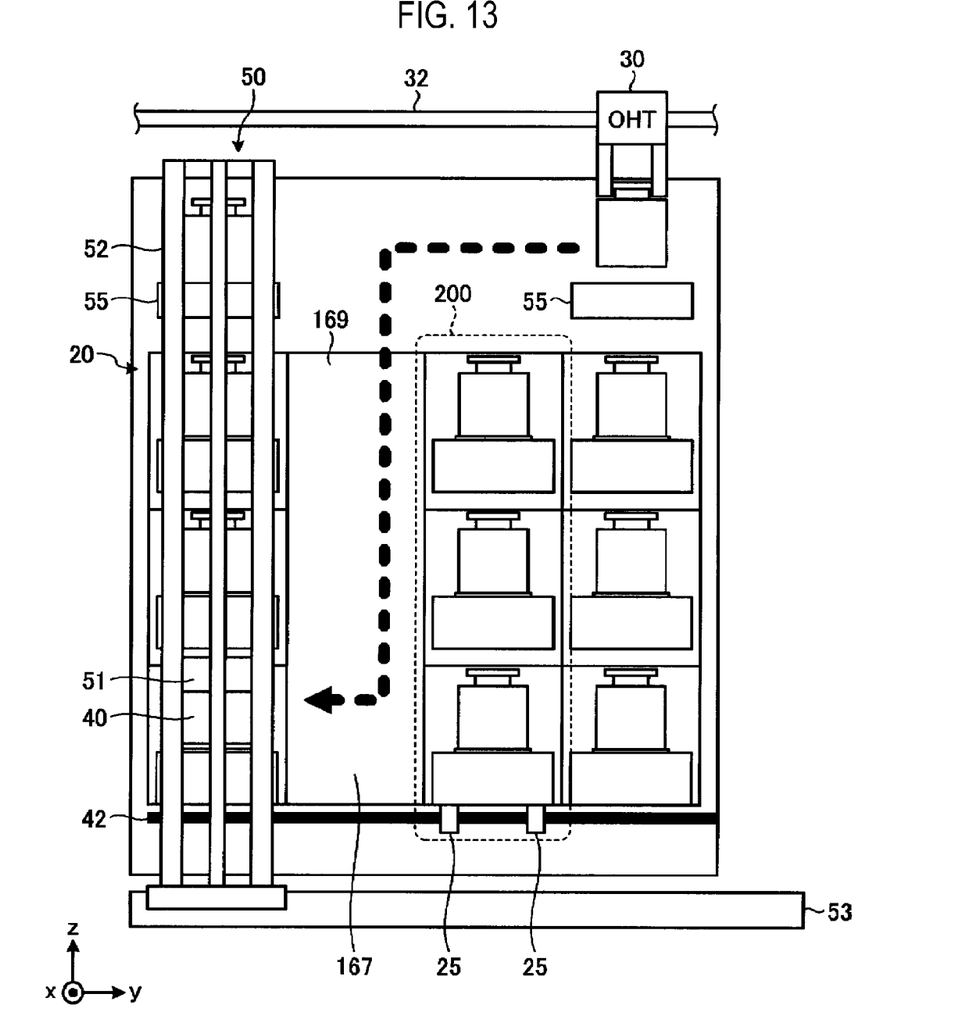
FIG. 13 is a view illustrating an example of movement of each connection unit in the second embodiment.

FIG. 13 is a view illustrating an example of the movement of each connection unit 20 in the second embodiment. With reference to FIG. 13, the movement of each connection unit 20 will be described by taking as an example a case where the FOUP 40 in which unprocessed wafers are accommodated is mounted on the lowermost connection unit 20 in the leftmost row.

First, the FOUP 40 in which unprocessed wafers are accommodated is mounted on one of the waiting tables 55 by the OHT 30. Then, the movement mechanisms 25 move the plurality of connection units 20 included in the row 200 in the right direction by rotating the nut into which the guide shaft 42 is inserted. As a result, the surface 169 on which no connection unit 20 is disposed is formed at the right side of the leftmost row.

Subsequently, in a state in which the gripping part 51 is located at the uppermost position of the frame 52, the transfer mechanism 50 moves in the lateral direction along the rail 53 to the position of the waiting table 55 on which the FOUP 40 in which unprocessed wafers are accommodated is mounted. Then, the gripping part 51 is lowered to the position of the FOUP 40 on the waiting table 55. The FOUP 40 is gripped by the gripping part 51. Thereafter, as the gripping part 51 moves upwards along the frame 52, the FOUP 40 is lifted up from the waiting table 55. Subsequently, the transfer mechanism 50 moves along the rail 53 to the position of the surface 169 on which no connection unit 20 is disposed. Then, the gripping part 51 is lowered along the frame 52 to the position of the lowermost connection unit 20.

Subsequently, the transfer mechanism 50 moves along the rail 53 to the position of the leftmost row. Thus, the FOUP 40 gripped by the gripping part 51 is transferred to the position of the lowermost connection unit 20 in the leftmost row. Then, when the gripping part 51 is lowered along the frame 52 to open the FOUP 40. The FOUP 40 is mounted on the stage 23 of the connection unit 20 in the lowermost stage in the leftmost row. In this way, the FOUP 40 in which unprocessed wafers are accommodated is mounted on the stage 23 of the connection unit 20 in the lowermost stage of the leftmost row, for example, along a path indicated by a broken-line arrow in FIG. 13. A procedure in which the FOUP 40 in which processed wafers are accommodated is transferred from the connection unit 20 to the waiting table 55 is performed in reverse order from when the FOUP 40 in which unprocessed wafers are accommodated is transferred from the waiting table 55 to the connection unit 20.

The second embodiment has been described above. Even in the substrate processing system 10 of the second embodiment, it is possible to dispose a large number of FOUPs 40 accommodating wafers in a small space. Further, in the substrate processing system 10 of the second embodiment, it is possible to provide an entrance for maintenance in the front surface of the LM 16A in which the plurality of connection units 20 is provided. Therefore, the side surfaces of the LM 16A may be effectively used as a space for mounting the connection units 20, an inspection unit and the like, which are parts other than the entrance for maintenance.

[Others]

The present disclosure is not limited to the above-described embodiments, and various modifications may be made within the scope and spirit of the present disclosure.

For example, in the first embodiment described above, in each of the stages from the uppermost stage to the third stage, the nut fitted to the guide shaft 42 having thread grooves formed therein is rotated by a motor or the like, and the connection units 20 are moved in the lateral direction along the guide shaft 42 by the movement mechanism 25. However, the present disclosure is not limited thereto. For example, the connection units 20 of each stage from the uppermost stage to the third stage may be moved in the lateral direction independently of one another by a ball screw. In this case, in each stage from the uppermost stage to the third layer, screw shafts may be provided by the number of connection units 20 arranged in each stage (three in the examples of FIGS. 1 to 10), and a motor that rotates each of the screw shafts may be installed in the LM 16. In addition, a nut to be fitted into the screw shaft may be fixed to each connection unit 20. As the motor rotates the screw shaft, the connection unit 20 to which the nut fitted into the screw shaft is fixed moves in the lateral direction. As a result, it is possible to reduce the number of components of each connection unit 20 and to reduce the cost of the connection units 20.

Similarly, even in the second embodiment, it may be possible to move the plurality of connection units 20 included in the row 200 in the lateral direction by rotating the screw shaft fitted into the nut fixed to the lowermost connection unit 20 of the row 200 by the motor.

While in the first embodiment described above, each connection unit 20 is moved in the lateral direction by rotating the nuts, the present disclosure is not limited thereto. In some embodiments, other movement mechanisms such as an air cylinder may be used to move each connection unit 20 in the lateral direction. This makes it possible to reduce the cost of the apparatus for moving each connection unit 20 in the lateral direction. Similarly, even in the second embodiment described above, the plurality of connection units 20 included in the row 200 may be moved in the lateral direction using other movement mechanisms such as an air cylinder.

In the second embodiment described above, in the connection unit 20 of the uppermost stage of the row 200, the FOUP 40 may be directly transferred by the OHT 30 without having to use the transfer mechanism 50.

According to various aspects and embodiments of the present disclosure, it is possible to arrange a large number of containers that accommodate target substrates in a small space.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A substrate transfer apparatus for unloading each of a plurality of target substrates, which is to be transferred to each of a plurality of processing devices, from each of a plurality of containers connected to the substrate transfer apparatus, each of the plurality of containers being configured to accommodate the plurality of target substrates, the substrate transfer apparatus comprising:
   a transfer chamber including an arm disposed to take out each of the plurality of target substrates which is to be transferred to each of the plurality of processing devices from each of the plurality of containers;
   a plurality of connection units arranged side by side in a vertical direction and a lateral direction along one side surface of the transfer chamber, and connected to the plurality of containers, respectively; and
   movement mechanisms configured to move at least one of the plurality of connection units in the lateral direction.

2. The substrate transfer apparatus of claim 1, wherein each of the plurality of connection units includes:
   a stage on which one of the plurality of containers is mounted;
   a frame installed between the container mounted on the stage and the transfer chamber and having an opening through which the arm takes out the target substrate from an interior of the container; and
   a door configured to open and close the opening of the frame.

3. The substrate transfer apparatus of claim 1, wherein the plurality of connection units are arranged in multiple stages in the vertical direction along the one side surface of the transfer chamber, and
   the number of the plurality of connection units arranged in each stage above a lowermost stage is smaller than the number of the plurality of connection units arranged in the lowermost stage.

4. The substrate transfer apparatus of claim 3, wherein the plurality of connection units arranged in the lowermost stage are fixed to the transfer chamber, and
   the plurality of connection units arranged in each stage above the lowermost stage are moved in the lateral direction by the movement mechanisms.

5. The substrate transfer apparatus of claim 1, wherein the plurality of connection units are arranged in a plurality of rows in the vertical direction along the one side surface of the transfer chamber,
   the plurality of rows includes the plurality of connection units, respectively, and
   the plurality of connection units included in at least one of the plurality of rows are moved as a unit on a row basis in the lateral direction by the movement mechanisms.

6. The substrate processing apparatus of claim 1, further comprising:
   a cover member configured to cover the one side surface of the transfer chamber, which corresponds to an empty space generated when the at least one of the plurality of connection units is moved by the movement mechanisms.

7. The substrate transfer apparatus of claim 1, wherein an interior of the transfer chamber is kept at a pressure higher than an atmospheric pressure.

8. The substrate transfer apparatus of claim 1, wherein the number of the plurality of connection units is larger than the number of the plurality of processing devices.

9. A substrate processing system comprising:
   a plurality of processing devices configured to process a plurality of target substrates; and
   a substrate transfer apparatus configured to unload each of the plurality of target substrates, which is to be transferred to each of the plurality of processing devices, from each of a plurality of containers connected to the substrate transfer apparatus, each of the plurality of containers being configured to accommodate the plurality of target substrates, wherein the substrate transfer apparatus includes:

a transfer chamber including an arm disposed to take out each of the plurality of target substrates which is to be transferred to each of the plurality of processing devices from each of the plurality of containers;

a plurality of connection units arranged side by side in a vertical direction and a lateral direction along one side surface of the transfer chamber, and connected to the plurality of containers, respectively; and movement mechanisms configured to move at least one of the plurality of connection units in the lateral direction.

* * * * *